United States Patent
Sugawara et al.

(10) Patent No.: US 11,527,719 B2
(45) Date of Patent: Dec. 13, 2022

(54) HOLE COLLECTION LAYER COMPOSITION FOR ORGANIC PHOTOELECTRIC CONVERSION ELEMENT

(71) Applicant: NISSAN CHEMICAL CORPORATION, Tokyo (JP)

(72) Inventors: Shun Sugawara, Funabashi (JP); Shinichi Maeda, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 329 days.

(21) Appl. No.: 16/772,526

(22) PCT Filed: Dec. 5, 2018

(86) PCT No.: PCT/JP2018/044663
§ 371 (c)(1),
(2) Date: Jun. 12, 2020

(87) PCT Pub. No.: WO2019/116977
PCT Pub. Date: Jun. 20, 2019

(65) Prior Publication Data
US 2020/0388762 A1    Dec. 10, 2020

(30) Foreign Application Priority Data
Dec. 15, 2017 (JP) .............................. JP2017-240158

(51) Int. Cl.
*H01L 51/00* (2006.01)
*C09D 7/61* (2018.01)
(Continued)

(52) U.S. Cl.
CPC ............ *H01L 51/0035* (2013.01); *C09D 5/24* (2013.01); *C09D 7/20* (2018.01); *C09D 7/45* (2018.01); *C09D 7/61* (2018.01); *C09D 7/63* (2018.01); *C09D 179/02* (2013.01); *C09K 11/02* (2013.01); *C09K 11/65* (2013.01); *H01L 51/0036* (2013.01); *H01L 51/0043* (2013.01); *H01L 51/0046* (2013.01); *H01L 51/424* (2013.01)

(58) Field of Classification Search
CPC ............. H01L 51/0035; H01L 51/0036; H01L 51/0043; H01L 51/0046; H01L 51/424; H01L 51/0003; H01L 51/4253; H01L 51/44; H01L 51/42; C09D 5/24; C09D 7/20; C09D 7/45; C09D 7/61; C09D 7/63; C09D 179/02; C09K 11/02; C09K 11/65; C08G 61/12; C08G 2261/124; C08G 2261/1424; C08G 2261/146; C08G 2261/316; C08G 2261/3223; C08G 2261/512; C08G 2261/91; C08G 61/126; C08G 73/0266; C08K 3/36; C08L 79/02; C08L 79/00; Y02E 10/549

USPC ......................................................... 257/40
See application file for complete search history.

(56) References Cited

U.S. PATENT DOCUMENTS 7,785,496 B1    8/2010 Shim et al.
8,268,195 B2 *  9/2012 Zheng ................... H01B 1/128
                                                   252/500

(Continued)

FOREIGN PATENT DOCUMENTS

EP    3373354 A1 *  9/2018  ............. C08G 73/02
JP    2003-234460 A   8/2003

(Continued)

OTHER PUBLICATIONS

C. W. Tang, "Two-layer organic photovoltaic cell", Appl. Phys. Lett., Jan. 13, 1986, vol. 48, No. 2, p. 183-185.
International Search Report, issued in PCT/JP2018/044663, PCT/ISA/210, dated Feb. 26, 2019.
Li et al., "Polymer solar cells", Nature Photonics, Mar. 2012, vol. 6, p. 153-161.

(Continued)

*Primary Examiner* — Douglas J McGinty
(74) *Attorney, Agent, or Firm* — Birch, Stewart, Kolasch & Birch, LLP

(57) ABSTRACT

This hole collection layer composition for an organic photoelectric conversion elements comprises: a charge-transporting substance formed of a polyaniline derivative represented by formula (1); fluorochemical surfactant; metal oxide nanoparticles; and a solvent. The hole collection layer composition provides a thin film having excellent adhesiveness to an active layer of an organic photoelectric conversion element.

(1)

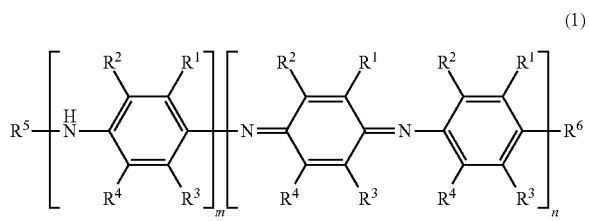

{$R^1$-$R^6$ are each independently a hydrogen atom, a halogen atom, a nitro group, a cyano group, a sulfonic acid group, a $C_1$-$C_{20}$ alkoxy group, a $C_1$-$C_{20}$ thioalkoxy group, a $C_1$-$C_{20}$ alkyl group, etc. Meanwhile, one of $R^1$-$R^4$ is a sulfonic acid group and at least one of the remaining $R^1$-$R^4$ is a $C_1$-$C_{20}$ alkoxy group, a $C_1$-$C_{20}$ thioalkoxy group, a $C_1$-$C_{20}$ alkyl group, etc., and m and n are numbers that satisfy $0 \leq m \leq 1$, $0 \leq n \leq 1$, and $m+n=1$.}

23 Claims, No Drawings

(51) Int. Cl.
*C09D 7/20* (2018.01)
*C09D 7/45* (2018.01)
*C09D 7/63* (2018.01)
*C09D 5/24* (2006.01)
*C09D 179/02* (2006.01)
*C09K 11/02* (2006.01)
*C09K 11/65* (2006.01)
*H01L 51/42* (2006.01)

(56) References Cited

U.S. PATENT DOCUMENTS

| | | | |
|---|---|---|---|
| 2008/0246853 A1 | 10/2008 | Takizawa et al. | |
| 2010/0270055 A1* | 10/2010 | Zheng | C08G 18/61 |
| | | | 252/500 |
| 2010/0308281 A1* | 12/2010 | Zheng | H01B 1/122 |
| | | | 252/500 |
| 2011/0095275 A1* | 4/2011 | Li | H01L 51/445 |
| | | | 977/762 |
| 2011/0272029 A1 | 11/2011 | Ihn et al. | |
| 2012/0175596 A1 | 7/2012 | Faircloth et al. | |
| 2016/0056397 A1* | 2/2016 | Schumann | H01L 51/0036 |
| | | | 252/500 |
| 2018/0315927 A1 | 11/2018 | Yoshimoto et al. | |
| 2021/0280805 A1* | 9/2021 | Yaacobi-Gross | H01L 51/0043 |

FOREIGN PATENT DOCUMENTS

| | | |
|---|---|---|
| JP | 2007-158059 A | 6/2007 |
| JP | 2008-258474 A | 10/2008 |
| JP | 2012-520381 A | 9/2012 |
| JP | 2014-175439 A | 9/2014 |
| JP | 2015-127409 A | 7/2015 |
| WO | WO 2017/077883 A1 | 5/2017 |

OTHER PUBLICATIONS

Lim et al., "Organic-on-silicon complementary metal-oxide-semiconductor colour image sensors", Scientific Reports, (2015), vol. 5: 7708, p. 1-7.

O'Regan el al., "A low-cost, hich-efficiency solar cell based on dye-sensitized colloidal TiO2 films", Nature, (1991), vol. 353, p. 737-740.

Written Opinion of the International Searching Authority, issued in PCT/JP2018/044663, PCT/ISA/237, dated Feb. 26, 2019.

Extended European Search Report for corresponding European Application No. 18839816.7, dated Aug. 26, 2021.

* cited by examiner

HOLE COLLECTION LAYER COMPOSITION FOR ORGANIC PHOTOELECTRIC CONVERSION ELEMENT

TECHNICAL FIELD

The present invention relates to a hole collection layer composition for an organic photoelectric conversion element.

BACKGROUND ART

Organic photoelectric conversion elements refer to devices that convert light energy to electrical energy with the use of an organic semiconductor, and include, for example, organic solar cells.

Organic solar cells refer to solar cell elements in which organic substances are used for active layers and charge-transporting substances, and the dye-sensitized solar cell developed by M. Grätzel and the organic thin-film solar cell developed by C. W. Tan are well known (Non-Patent Documents 1 and 2).

The cells are all lightweight thin films, which have different features from currently mainstream inorganic solar cells, such as that the films can be made flexible and produced in a roll-to-roll manner, and thus expected to form new markets.

Among the cells, the organic thin-film solar cells have features such as being electrolyte-free and heavy metal compound-free, and, in addition, have been attracting much attention for reasons such as that the group of UCLA et al recently reported a photoelectric conversion efficiency (hereinafter abbreviated as PCE) of 10.6% (Non-Patent Document 3).

On the other hand, the organic thin-film solar cells have, as compared with photoelectric conversion elements that use existing silicon-based materials, features such as exhibiting higher photoelectric conversion efficiency even at low illuminance, allowing thinner elements and finer pixels, and allowing the properties of color filters to be combined, and thus have been attracting attention not only for solar cell applications but also for optical sensor applications including image sensors (Patent Documents 1 and 2, Non-Patent Document 4). Hereinafter, organic solar cells (dye-sensitized solar cells and organic thin-film solar cells) additionally including applications such as optical sensors are collectively referred to as organic photoelectric conversion elements (hereinafter sometimes abbreviated as OPVs).

The organic photoelectric conversion element includes an active layer (photoelectric conversion layer), a charge (hole, electron) collection layer, electrodes (anode, cathode), and the like.

Among these layers, the active layer and the charge collection layer are typically formed by a vacuum deposition method, but the vacuum deposition method has problems in terms of complexity due to the mass production process, increased apparatus cost, material use efficiency, and the like.

From these points of view, a water-dispersible polymer organic conductive material such as PEDOT/PSS may be used as a coating material for the hole collection layer, but the PEDOT/PSS aqueous dispersion has the property that the solids are easily agglomerated, thus has the problems of being likely to cause coating film defects and likely to cause the coater to be clogged and corroded, and moreover has insufficient heat resistance, and there are various problems left for mass production.

PRIOR ART DOCUMENTS

Patent Documents

Patent Document 1: JP-A 2003-234460
Patent Document 2: JP-A 2008-258474

Non-Patent Documents

Non-Patent Document 1: Nature, vol. 353, 737-740 (1991)
Non-Patent Document 2: Appl. Phys. Lett., Vol. 48, 183-185 (1986)
Non-Patent Document 3: Nature Photonics Vol. 6, 153-161 (2012)
Non-Patent Document 4: Scientific Reports, Vol. 5: 7708, 1-7 (2015)

SUMMARY OF INVENTION

Technical Problem

The present invention has been achieved in view of the above-mentioned circumstances, and an object of the invention to provide a hole collection layer composition for an organic photoelectric conversion element, which provides a thin film with excellent adhesion to an active layer, preferred as a hole collection layer for an organic photoelectric conversion element, and is suitable for the preparation of in particular, an inversely stacked organic photoelectric conversion element.

Solution to Problem

The present inventors have found that, as a result of earnest studies for achieving the object mentioned above, a polymer containing, as a repeating unit, an anilinesulfonic acid substituted with a predetermined electron-donating substituent such as an alkoxy group exhibits high hole-transporting property, also exhibits high solubility in protic polar solvents such as alcohol and water, which have low corrosiveness to an active layer, and thus forms a homogeneous solution, and in the case of providing a thin film as a hole collection layer for an OPV element in accordance with a coating step with the use of the solution, achieves an OPV element which has a favorable PCE at a high yield; that the addition of an electron-accepting dopant substance mainly composed of a Bronsted acid with high oxidation power in the preparation of the solution mentioned above, makes it possible to control the HOMO level of a thin film obtained, thus making it possible to efficiently collect and transport holes, and as a result, achieving an OPV element which has a higher PCE and exhibits high durability; that the further addition of metal oxide nanoparticles to the solution mentioned above can improve the adhesion of the obtained thin film to the active layer; and that the addition of a fluorochemical surfactant to the solution mentioned above achieves a hole collection layer composition which is excellent in film formation property on the active layer and suitable for the preparation of an inversely stacked organic photoelectric conversion element, and then achieved the present invention.

More specifically, the present invention provides the following:
1. A hole collection layer composition for an organic photoelectric conversion element, including a charge-transporting substance including a polyaniline derivative represented by the formula (1), a fluorochemical surfactant, metal oxide nanoparticles, and a solvent:

[Chem. 1]

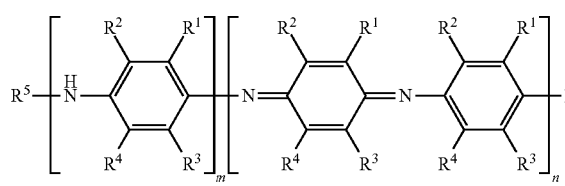

wherein $R^1$ to $R^6$ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, and an aralkyl group having 7 to 20 carbon atoms, or an acyl group having 1 to 20 carbon atoms, one of $R^1$ to $R^4$ is a sulfonic acid group, and one or more of the remaining $R^1$ to $R^4$ are an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, or an aralkyl group having 7 to 20 carbon atoms, and m and n are respectively numbers that meet $0 \leq m \leq 1$, $0 \leq n \leq 1$, and $m+n=1$.
2. The hole collection layer composition for an organic photoelectric conversion element according to 1, wherein the metal oxide nanoparticles are $SiO_2$.
3. The hole collection layer composition for an organic photoelectric conversion element according to 2, wherein the $SiO_2$ is a silica sol.
4. The hole collection layer composition for an organic photoelectric conversion element according to 3, wherein a dispersion medium of the silica sol is water.
5. The hole collection layer composition for an organic photoelectric conversion element according to any of 1 to 4, wherein the fluorochemical surfactant is a fluorochemical nonionic surfactant.
6. The hole collection layer composition for an organic photoelectric conversion element according to 5, wherein the fluorochemical nonionic surfactant is at least one selected from the following formulas (A2) and (B2):

[Chem. 2]

$R_f COO(CH_2CH_2O)_n H$      (A2)

$R_f (CH_2CH_2O)_n H$      (B2)

wherein $R_f$ each independently represents a perfluoroalkyl group having 1 to 40 carbon atoms, and n each independently represents an integer of 1 to 20.

7. The hole collection layer composition for an organic photoelectric conversion element according to any of 1 to 6, wherein the $R^1$ is a sulfonic acid group, and the $R^4$ is an alkoxy group having 1 to 20 carbon atoms.
8. The hole collection layer composition for an organic photoelectric conversion element according to any of 1 to 7, the hole collection layer composition including an electron-accepting dopant substance that is different from the polyaniline derivative represented by the formula (1).
9. The hole collection layer composition for an organic photoelectric conversion element according to 8, wherein the electron-accepting dopant substance is a Brønsted acid.
10. The hole collection layer composition for an organic photoelectric conversion element according to 9, wherein the electron-accepting dopant substance is an arylsulfonic acid compound represented by the formula (2):

[Chem. 3]

$$\left( \begin{array}{c} A-X \\ | \\ (SO_3H)_l \end{array} \right)_q B$$      (2)

wherein X represents O, A represents a naphthalene ring or an anthracene ring, B represents a divalent to tetravalent perfluorobiphenyl group, l represents the number of sulfonic acid groups bonded to A, and is an integer that meets $1 \leq l \leq 4$, and q represents the number of bonds between B and X, and is an integer that meets 2 to 4.
11. The hole collection layer composition for an organic photoelectric conversion element according to any of 1 to 10, wherein the solvent includes one, or two or more solvents selected from alcohol solvents and water.
12. The hole collection layer composition for an organic photoelectric conversion element according to any of 1 to 11, wherein the organic photoelectric conversion element is an organic thin-film solar cell, a dye-sensitized solar cell, or an optical sensor.
13. A hole collection layer obtained by using the hole collection layer composition for an organic photoelectric conversion element according to any of 1 to 11.
14. An organic photoelectric conversion element including the hole collection layer according to 13.
15. An organic photoelectric conversion element including the hole collection layer according to 13 and an active layer provided so as to be brought into contact with the hole collection layer.
16. The organic photoelectric conversion element according to 14 or 15, wherein the active layer includes a fullerene derivative.
17. The organic photoelectric conversion element according to 14 or 15, wherein the active layer includes a polymer including a thiophene skeleton in a main chain.
18. The organic photoelectric conversion element according to 14 or 15, wherein the active layer includes a fullerene derivative and a polymer including a thiophene skeleton in a main chain.
19. The organic photoelectric conversion element according to any of 14 to 18, wherein the organic photoelectric conversion element is of an inversely stacked type.
20. The organic photoelectric conversion element according to any of 14 to 19, wherein the organic photoelectric conversion element is an organic thin-film solar cell, a dye-sensitized solar cell, or an optical sensor.

21. The organic photoelectric conversion element according to 20, wherein the organic photoelectric conversion element has a top-anode structure.

22. A charge-transporting composition including a charge-transporting substance including a polyaniline derivative represented by the formula (1), an electron-accepting dopant substance that is different from the polyaniline derivative represented by the

[Chem. 4]

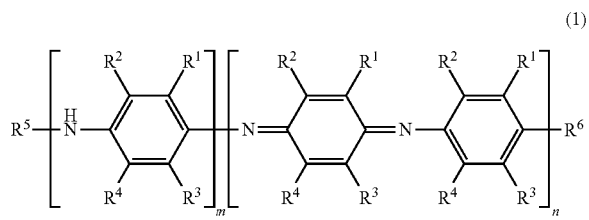

(1)

wherein $R^1$ to $R^6$ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, and an aralkyl group having 7 to 20 carbon atoms, or an acyl group having 1 to 20 carbon atoms, one of $R^1$ to $R^4$ is a sulfonic acid group, and one or more of the remaining $R^1$ to $R^4$ are an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, or an aralkyl group having 7 to 20 carbon atoms, and m and n are respectively numbers that meet $0 \leq m \leq 1$, $0 \leq n \leq 1$, and $m+n=1$.

23. The charge-transporting composition according to 22, wherein the electron-accepting dopant substance is an arylsulfonic acid compound represented by the formula (2):

[Chem. 5]

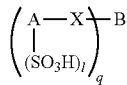

(2)

wherein X represents O, A represents a naphthalene ring or an anthracene ring, B represents a divalent to tetravalent perfluorobiphenyl group, l represents the number of sulfonic acid groups bonded to A, and is an integer that meets $1 \leq l \leq 4$, and q represents the number of bonds between B and X, and is an integer that meets 2 to 4.

Advantageous Effects of Invention

The hole collection layer composition of the present invention for an organic photoelectric conversion element can be not only produced with the use of a charge-transporting substance composed of a polyaniline derivative which is commercially available inexpensively in the market or can be simply synthesized by a known method, but also allows an organic thin-film solar cell which is excellent in PCE to be obtained in the case where a thin film obtained from the composition is used as a hole collection layer. In addition, it is possible to form highly uniform thin films with the use of the hole collection layer composition of the present invention, and thus, the highly uniform thin film as a hole collection layer can reduce the current leakage, and then keep the reverse bias dark current low. Accordingly, it is possible to apply a thin film composed of the hole collection layer composition of the present invention to an element structure which is similar to an organic thin-film solar cell, and convert a slight number of photons to electrons and detect the electrons, and it is thus possible to apply hole collection layers obtained from the composition to optical sensor applications such as high-performance image sensor applications.

In addition, the charge-transporting substance composed of a polyaniline derivative for use in the present invention has excellent solubility in a protic polar solvent such as alcohols or water, allows compositions to be prepared with the use of a solvent which is less likely to adversely affect the active layers, furthermore, including the fluorochemical surfactant thus allows films to be easily formed on the active layers, and including the metal oxide nanoparticles thus provides excellent adhesion to the active layers, and thus, the composition is also suitable for the preparation of inversely stacked organic thin-film solar cells.

Furthermore, adding the electron-accepting dopant substance composed of a Bronsted acid provides an OPV element which exhibits higher PCE and exhibits high durability.

DESCRIPTION OF EMBODIMENTS

The present invention is described in more detail.

The hole collection layer composition of the present invention for an organic photoelectric conversion element includes a charge-transporting substance composed of a polyaniline derivative represented by the formula (1), a fluorochemical surfactant, and a solvent.

[Chem. 6]

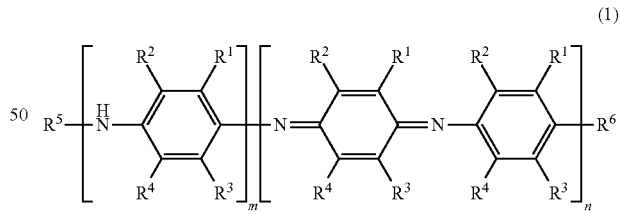

(1)

In the formula (1), $R^1$ to $R^6$ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, an aralkyl group having 7 to 20 carbon atoms, or an acyl group having 1 to 20 carbon atoms, one of $R^1$ to $R^4$ is a sulfonic acid group, and one or more of the remaining $R^1$ to $R^4$ are an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, or an aralkyl group having 7 to 20 carbon atoms.

Examples of the halogen atom include a fluorine atom, a chlorine atom, a bromine atom, and an iodine atom.

Specific examples of the alkyl group having 1 to 20 carbon atoms include: chain alkyl groups having 1 to 20 carbon atoms, such as a methyl group, ethyl group, n-propyl group, an isopropyl group, n-butyl group, an isobutyl group, s-butyl group, t-butyl group, n-pentyl group, n-hexyl group, n-heptyl group, n-octyl group, n-nonyl group, and n-decyl group; and cyclic alkyl groups having 3 to 20 carbon atoms, such as a cyclopropyl group, cyclobutyl group, cyclopentyl group, cyclohexyl group, cycloheptyl group, cyclooctyl group, cyclononyl group, cyclodecyl group, bicyclobutyl group, bicyclopentyl group, bicyclohexyl group, bicycloheptyl group, bicyclooctyl group, bicyclononyl group, and bicyclodecyl group.

Specific examples of the alkenyl group having 2 to 20 carbon atoms include an ethenyl group, n-1-propenyl group, n-2-propenyl group, 1-methylethenyl group, n-1-butenyl group, n-2-butenyl group, n-3-butenyl group, 2-methyl-1-propenyl group, 2-methyl-2-propenyl group, 1-ethylethenyl group, 1-methyl-1-propenyl group, 1-methyl-2-propenyl group, n-1-pentenyl group, an n-1-decenyl group, and an n-1-eicosenyl group.

Specific examples of the alkynyl group having 2 to 20 carbon atoms include an ethynyl group, n-1-propynyl group, n-2-propynyl group, n-1-butynyl group, n-2-butynyl group, n-3-butynyl group, 1-methyl-2-propynyl group, n-1-pentynyl group, n-2-pentynyl group, n-3-pentynyl group, n-4-pentynyl group, 1-methyl-n-butynyl group, 2-methyl-n-butynyl group, 3-methyl-n-butynyl group, 1,1-dimethyl-n-propynyl group, n-1-hexynyl group, n-1-decynyl group, n-1-pentadecynyl group, and n-1-eicosinyl group.

Specific examples of the alkoxy group having 1 to 20 carbon atoms include a methoxy group, ethoxy group, n-propoxy group, i-propoxy group, c-propoxy group, n-butoxy group, i-butoxy group, s-butoxy group, t-butoxy group, n-pentoxy group, n-hexoxy group, n-heptyloxy group, n-octyloxy group, n-nonyloxy group, n-decyloxy group, n-undecyloxy group, n-dodecyloxy group, n-tridecyloxy group, n-tetradecyloxy group, n-pentadecyloxy group, n-hexadecyloxy group, n-heptadecyloxy group, n-octadecyloxy group, n-nonadecyloxy group, and n-eicosanyloxy group.

Specific examples of the thioalkoxy group having 1 to 20 carbon atoms include groups where an oxygen atom of the above-mentioned alkoxy group is substituted with a sulfur atom.

Specific examples of the thioalkoxy (alkylthio) group having 1 to 20 carbon atoms include a methylthio group, ethylthio group, n-propylthio group, an isopropylthio group, n-butylthio group, an isobutylthio group, s-butylthio group, t-butylthio group, n-pentylthio group, n-hexylthio group, n-heptylthio group, n-octylthio group, n-nonylthio group, n-decylthio group, n-undecylthio group, n-dodecylthio group, n-tridecylthio group, n-tetradecylthio group, n-pentadecylthio group, n-hexadecylthio group, n-heptadecylthio group, n-octadecylthio group, n-nonadecylthio group, and n-eicosanylthio group.

Examples of the haloalkyl group having 1 to 20 carbon atoms include a group where at least one of hydrogen atoms in the alkyl group mentioned above is substituted with a halogen atom. It is to be noted that the halogen atom may be any of chlorine, bromine, iodine and fluorine atoms. Among the groups, a fluoroalkyl group is preferred, and a perfluoroalkyl group is more preferred.

Specific examples thereof include a fluoromethyl group, difluoromethyl group, trifluoromethyl group, pentafluoroethyl group, 2,2,2-trifluoroethyl group, heptafluoropropyl group, and 2,2,3,3,3-pentafluoropropyl group, 2,2,3,3-tetrafluoropropyl group, 2,2,2-trifluoro-1-(trifluoromethyl) ethyl group, nonafluorobutyl group, 4,4,4-trifluorobutyl group, undecafluoropentyl group, 2,2,3,3,4,4,5,5,5-nonafluoropentyl group, 2,2,3,3,4,4,5,5-octafluoropentyl group, tridecafluorohexyl group, 2,2,3,3,4,4,5,5,6,6-undecafluorohexyl group, 2,2,3,3,4,4,5,5,6,6-decafluorohexyl group, and 3,3,4,4,5,5,6,6,6-nonafluorohexyl group.

Specific examples of the aryl group having 6 to 20 carbon atoms include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, and 9-phenanthryl group.

Specific examples of the aralkyl group having 7 to 20 carbon atoms include a benzyl group, p-methylphenylmethyl group, m-methylphenylmethyl group, o-ethylphenylmethyl group, m-ethylphenylmethyl group, p-ethylphenylmethyl group, 2-propylphenylmethyl group, 4-isopropylphenylmethyl group, 4-isobutylphenylmethyl group, and α-naphthylmethyl group.

Specific examples of the acyl group having 1 to 20 carbon atoms include a formyl group, acetyl group, propionyl group, butyryl group, isobutyryl group, valeryl group, isovaleryl group, and benzoyl group.

As described above, in the polyaniline derivative of the formula (1) for use in the present invention, one of $R^1$ to $R^4$ is a sulfonic acid group, and one or more of the remaining $R^1$ to $R^4$, preferably, any one of the remaining $R^1$ to $R^4$ is, as an electron-donating group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, or an aralkyl group having 7 to 20 carbon atoms, in particular, an alkoxy group having 1 to 20 carbon atoms, a thioalkoxy group having 1 to 20 carbon atoms, and an alkyl group having 1 to 20 carbon atoms are preferred, an alkoxy group having 1 to 20 carbon atoms is more preferred, and an alkoxy group having 1 to 10 carbon atoms is even more preferred.

The substitution position is not to be considered particularly limited, but in the present invention, $R^1$ is preferably a sulfonic acid group, and $R^4$ is preferably an alkoxy group having 1 to 20 carbon atoms.

Furthermore, $R^2$, $R^3$, $R^5$, and $R^6$ are all preferably hydrogen atoms.

In the formula (1), m and n are respectively numbers that satisfy $0 \leq m \leq 1$, $0 \leq n \leq 1$, and $m+n=1$, and in consideration of further increasing the conductivity of the hole collection layer, $0<n<1$ is preferred, and $0.1 \leq n \leq 0.9$ is more preferred.

The weight average molecular weight of the polyaniline derivative represented by the formula (1) is not to be considered particularly limited, but in consideration of conductivity, the lower limit is typically 200 or more, preferably 1,000 or more, and in consideration of improvement in the solubility in a solvent, the upper limit is typically 5,000,000 or less, preferably 500,000 or less. It is to be noted that the weight average molecular weight refers to a value in terms of polystyrene measured by gel permeation chromatography.

In the composition of the present invention, the polyaniline derivative represented by the formula (1) may be used alone, or two or more compounds may be used in combination.

In addition, for the polyaniline derivative represented by the formula (1), a commercially available product may be used, or a polyaniline derivative may be used which is obtained through polymerization by a known method with the use of an aniline derivative or the like as a starting material, but in each case, it is preferable to use a polyaniline derivative purified by a method such as reprecipitation or ion exchange. The use of the purified polyaniline derivative allows the characteristics of an OPV element including a thin film obtained from a composition containing the compound to be further improved.

In an organic thin-film solar cell, the ionization potential of the hole collection layer preferably has a value close to the ionization potential of the p-type semiconductor material in an active layer. The absolute value of the difference is preferably from 0 to 1 eV, more preferably 0 to 0.5 eV, even more preferably 0 to 0.2 eV.

Therefore, the hole collection layer composition of the present invention may include an electron-accepting dopant substance for the purpose of adjusting the ionization potential of a charge-transporting thin film obtained with the use of the composition.

The electron-accepting dopant substance is not particularly limited, as long as the substance is soluble in at least one solvent used.

Specific examples of the electron-accepting dopant substance include inorganic strong acids such as hydrogen chloride, sulfuric acid, nitric acid, and phosphoric acid; Lewis acids such as aluminum chloride (III) (AlCl$_3$), titanium tetrachloride (IV) (TiCl$_4$), boron tribromide (BBr$_3$), boron trifluoride etherate complex (BF$_3$-OEt$_2$), iron chloride (III) (FeCl$_3$), copper chloride (II) (CuCl$_2$), antimony pentachloride (V) (SbCl$_5$), arsenic pentafluoride (V) (AsF$_5$), phosphorus pentafluoride (PF$_5$), and tris(4-bromophenyl) aluminum hexachloroantimonate (TBPAH); strong organic acids such as benzenesulfonic acid, tosylic acid, camphorsulfonic acid, hydroxybenzenesulfonic acid, 5-sulfosalicylic acid, dodecylbenzene sulfonic acid, polystyrene sulfonic acid, the 1,4-benzodioxane disulfonic acid compound described in WO 2005/000832, the arylsulfonic acid compound described in WO 2006/025342, the dinonylnaphthalenesulfonic acid described in JP-A 2005-108828, and 1,3, 6-naphthalenetrisulfonic acid; organic oxidants such as 7,7, 8,8-tetracyanoquinodimethane (TCNQ), 2,3-dichloro-5,6-dicyano-1,4-benzoquinone (DDQ), and iodine; and inorganic oxidants such as heteropolyacid compounds, e.g., phosphomolybdic acid, phosphotungstic acid, and phosphotungsto-molybdic acid, described in WO 2010/058777, and these substances may be used alone, or two or more thereof may be used in combination.

Among the various electron-accepting dopant substances mentioned above, in the present invention, in particular, the Bronsted acids that donate H$^+$ are preferred, the arylsulfonic acid compounds are more preferred, and the arylsulfonic acid compounds represented by the formula (2) are particularly preferred.

[Chem. 7]

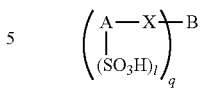

(in the formula, X represents O, A represents a naphthalene ring or an anthracene ring, B represents a divalent to tetravalent perfluorobiphenyl group, l represents the number of sulfonic acid groups bonded to A, and is an integer that meets 1≤l≤4, and q represents the number of bonds between B and X, and is an integer that meets 2 to 4.)

In the present invention, examples of the arylsulfonic acid compounds that can be suitably used include the following compounds (formula (2-1)).

[Chem. 8]

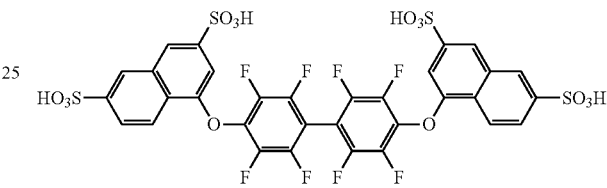

Furthermore, the composition of the present invention includes a fluorochemical surfactant.

The fluorochemical surfactant is not to be considered particularly limited as long as the surfactant contains a fluorine atom, and may be cationic, anionic, or nonionic, but fluorochemical nonionic surfactant are preferred, and in particular, at least one fluorochemical nonionic surfactant selected from the following formulas (A1) and (B1) is preferred.

[Chem. 9]

  (A1)

  (B1)

In the formula mentioned above, R represents a monovalent organic group containing a fluorine atom, and n represents an integer of 1 to 20.

Specific examples of the organic group include an alkyl group having 1 to 40 carbon atoms, an aryl group having 6 to 20 carbon atoms, an aralkyl group having 7 to 20 carbon atoms, and a heteroaryl group having 2 to 20 carbon atoms.

Specific examples of the heteroaryl group include 2-thienyl group, 3-thienyl group, 2-furanyl group, 3-furanyl group, 2-oxazolyl group, 4-oxazolyl group, 5-oxazolyl group, 3-isoxazolyl group, 4-isoxazolyl group, 5-isoxazolyl group, 2-thiazolyl group, 4-thiazolyl group, 5-thiazolyl group, 3-isothiazolyl group, 4-isothiazolyl group, 5-isothiazolyl group, 2-imidazolyl group, 4-imidazolyl group, 2-pyridyl group, 3-pyridyl group, 4-pyridyl group, 2-pyrazyl group, 3-pyrazyl group, 5-pyrazyl group, 6-pyrazyl group, 2-pyrimidyl group, 4-pyrimidyl group, 5-pyrimidyl group, 6-pyrimidyl group, 3-pyridazyl group, 4-pyridazyl group, 5-pyridazyl group, 6-pyridazyl group, 1,2,3-triazine-4-yl group, 1,2,3-triazine-5-yl group, 1,2,4-triazine-3-yl group, 1,2,4-triazine-5-yl group, 1,2,4-triazine-6-yl group, and 1,3, 5-triazine-2-yl group.

In addition, specific examples of the alkyl group, the aryl group, and the aralkyl group include the same groups as described above.

The n mentioned above is not to be considered particularly limited as long as the n is an integer of 1 to 20, but more preferably an integer of 1 to 10.

Among these surfactants, at least one fluorochemical nonionic surfactant selected from is more preferred which is selected from a perfluoroalkylpolyoxyethylene ester represented by the following (A2) having a perfluoroalkyl group $R_f$ having 1 to 40 carbon atoms and a perfluoroalkylpolyoxyethylene ether represented by the following (B2), or fluorotelomer alcohols.

[Chem. 10]

$$R_fCOO(CH_2CH_2O)_nH \qquad (A2)$$

$$R_f(CH_2CH_2O)_nH \qquad (B2)$$

(In the formula, n represents the same meaning as mentioned above.)

The fluorochemical surfactant for use in the present invention can be obtained as a commercially available product.

Such commercially available products include, but not limited thereto, Capstone (registered trademark) FS-10, FS-22, FS-30, FS-31, FS-34, FS-35, FS-50, FS-51, FS-60, FS-61, FS-63, FS-64, FS-65, FS-66, FS-81, FS-83, and FS-3100, manufactured by DuPont; and Neugen FN-1287 manufactured by DKS Co., Ltd.

In particular, Capstones FS-30, 31, 34, 35, and 3100, and Neugen FN-1287 are preferred which are nonionic surfactants.

In the composition of the present invention, the content of the fluorochemical surfactant is not to be considered particularly limited, but in consideration of the balance between the improvement of the film formation property on the active layer and the decrease in the photoelectric conversion efficiency due to the addition, is preferably 0.05 to 10% by weight, more preferably 0.05 to 5.0% by weight, even more preferably 0.07 to 2.0% by weight, still more preferably 0.10 to 1.0% by weight, based on the whole composition.

Furthermore, the compositions of the present invention include one or more metal oxide nanoparticles. The nanoparticles mean fine particles with a mean particle size for primary particles on the order of nanometers (typically 500 nm or less). The metal oxide nanoparticles mean a metal oxide formed into nanoparticles.

The primary particle sizes of the metal oxide nanoparticles for use in the present invention are not to be considered particularly limited as long as the nanoparticles are nanosized particles, but preferably 2 to 150 nm, more preferably 3 to 100 nm, even more preferably 5 to 50 nm in consideration of further increasing the adhesion to the active layer. It is to be noted that the particle sizes refer to values measured by the BET method with the use of a nitrogen adsorption isotherm.

The metal constituting the metal oxide nanoparticles in the present invention encompasses a metalloid in addition to a metal in the normal sense.

The metal in the normal sense is not to be considered particularly limited, but it is preferable to use one, or two or more selected from the group consisting of tin (Sn), titanium (Ti), aluminum (Al), zirconium (Zr), zinc (Zn), niobium (Nb), tantalum (Ta), and tungsten (W).

On the other hand, the metalloid means an element with chemical and/or physical properties intermediate between metals and non-metals. Although the universal definition of the metalloid has not been established, six elements of boron (B), silicon (Si), germanium (Ge), arsenic (As), antimony (Sb), and tellurium (Te) in total are regarded as the metalloid in the present invention. These metalloids may be used alone, or two or more thereof may be used in combination, and the metalloids may be used in combination with a metal in the normal sense.

The metal oxide nanoparticles for use in the present invention preferably include oxides of one, or two or more metals selected from boron (B), silicon (Si), germanium (Ge), arsenic (As), antimony (Sb), tellurium (Te), tin (Sn), titanium (Ti), aluminum (Al), zirconium (Zr), zinc (Zn), niobium (Nb), tantalum (Ta), and tungsten (W). It is to be noted that in the case of a combination of two or more metals, the metal oxide may be a mixture of oxides of individual single metals or a complex oxide including multiple metals.

Specific examples of the metal oxides include $B_2O_3$, $B_2O$, $SiO_2$, $SiO$, $GeO_2$, $GeO$, $As_2O_4$, $As_2O_3$, $As_2O_5$, $Sb_2O_3$, $Sb_2O_5$, $TeO_2$, $SnO_2$, $ZrO_2$, $Al_2O_3$, $ZnO$, and $B_2O_3$, $B_2O$, $SiO_2$, $SiO$, $GeO_2$, $GeO$, $As_2O_4$, $As_2O_3$, $As_2O_5$, $SnO_2$, $SnO$, $Sb_2O_3$, $TeO_2$, and mixtures thereof are preferred, and $SiO_2$ is more preferred.

It is to be noted that the metal oxide nanoparticles may include one or more organic capping groups. The organic capping groups may be reactive or non-reactive. Examples of the reactive organic capping groups include organic capping groups that can be cross-linked by ultraviolet light or a radical initiator.

In the composition of the present invention, the compounding amount of the metal oxide nanoparticles is not to be considered particularly limited, but in consideration of sufficiently producing the adhesion to the active layer, is preferably 1 to 50% by weight, more preferably 3 to 40% by weight with respect to the charge-transporting substance.

It is to be noted that in the case of using the charge-transporting substance as a solution or a dispersion, the additive amount of the metal oxide nanoparticles is based on the solid content of the charge-transporting substance.

In particular, in the present invention, it is preferable to use a silica sol with $SiO_2$ nanoparticles dispersed in a dispersion medium as the metal oxide nanoparticles.

The silica sol is not to be considered particularly limited, and may be appropriately selected from known silica sols.

Commercial silica sols usually have the form of a dispersion. The commercially available silica sols include $SiO_2$ nanoparticles dispersed in various solvents, for example, water, methanol, methyl ethyl ketone, methyl isobutyl ketone, N,N-dimethylacetamide, ethylene glycol, isopropanol, methanol, ethylene glycol monopropyl ether, cyclohexanone, ethyl acetate, toluene, and propylene glycol monomethyl ether acetate.

In particular, in the present invention, a silica sol where the dispersion medium is an alcohol solvent or water is preferred, and a silica sol where the dispersion medium is water is more preferred. As the alcohol solvent, water-soluble alcohols are preferred, and methanol, 2-propanol, and ethylene glycol are more preferred.

Specific examples of commercially available silica sols include, but not limited thereto, SNOWTEX (registered trademark) ST-O, ST-OS, ST-O-40, ST-OL manufactured by Nissan Chemical Corporation, and water-dispersed silica sols such as SILICADOL 20, 30, and 40 manufactured by NIPPON CHEMICAL INDUSTRIAL CO., LTD.; and organosilica sols such as methanol silica sols manufactured by Nissan Chemical Corporation, MA-ST-M, MA-ST-L, IPA-ST, IPA-ST-L, IPA-ST-ZL, and EG-ST.

In addition, the solid content concentration of the silica sol is not to be considered particularly limited, but is preferably 5 to 60% by weight, more preferably 10 to 50% by weight, even more preferably 15 to 30% by weight.

In the composition of the present invention, the compounding amount of the silica sol is not to be considered particularly limited, but in consideration of sufficiently producing the adhesion to the active layer, is preferably 5 to 30% by weight, more preferably 6 to 25% by weight with respect to the charge-transporting substance.

It is to be noted that this compounding amount is also based on the solid content of the charge-transporting substance in the same manner as mentioned above.

Furthermore, the composition of the present invention may include an alkoxysilane. Including the alkoxysilane makes it possible to improve the solvent resistance and water resistance of the obtained thin film, improve the electron blocking property, and adjust the HOMO level and the LUMO level to optimal values with respect to the active layer. It is to be noted that the alkoxysilane may be a siloxane-based material.

As the alkoxysilane, any one or more alkoxysilanes of tetraalkoxysilanes, trialkoxysilanes, and dialkoxysilanes can be used, and in particular, a tetraethoxysilane, a tetramethoxysilane, a phenyltriethoxysilane, a phenyltrimethoxysilane, a methyltriethoxysilane, a methyltrimethoxysilane, 3,3,3-trifluoropropyltrimethoxysilane, a dimethyldiethoxysilane, and a dimethyldimethoxysilane are preferred, and a tetraethoxysilane is more preferred.

Examples of the siloxane-based material include polysiloxanes such as poly(tetraethoxysilane) and poly(phenylethoxysilane), obtained by reactions such as hydrolysis of the alkoxysilanes.

The additive amount of the alkoxysilane is not particularly limited as long as the above-mentioned effect is produced, but is preferably 0.0001 to 100 times, more preferably 0.01 to 50 times, even more 0.05 to 10 times in ratio by weight with respect to the polyaniline derivative for use in the present invention.

Further, the composition of the present invention may be blended with other additives, as long as the object of the present invention can be achieved.

The types of the additives can be appropriately selected from known additives and used, depending on the desired effects.

Highly soluble solvents that can favorably dissolve the polyaniline derivative and the electron-accepting dopant substance can be used as a solvent for use in the preparation of the hole collection layer composition. One of the highly soluble solvents can be used alone, or two or more thereof can be used in mixture, and the usage thereof can be 5 to 100% by weight, based on the whole solvent used for the composition.

Examples of such highly soluble solvents include water; and organic solvents, e.g., alcohol solvents such as ethanol, 2-propanol, 1-butanol, 2-butanol, s-butanol, t-butanol, 1-methoxy-2-propanol; and amide solvents such as N-methylformamide, N,N-dimethylformamide, N,N-diethylformamide, N-methylacetamide, N,N-dimethylacetamide, N-methylpyrrolidone, and 1,3-dimethyl-2-imidazolidinone.

Among these solvents, at least one selected from water and the alcohol-based solvents is preferred, and water, ethanol, and 2-propanol are more preferred.

In particular, in the case of use for the formation of a hole collection layer for an inversely stacked OPV, it is preferable to use a solvent composed of only one, or two or more solvents selected from alcohol solvents and water, which do not adversely affect the active layer.

The charge-transporting substance and the electron-accepting dopant substance are preferably both completely dissolved or uniformly dispersed in the above-mentioned solvent, and in consideration of reproducibly obtaining a hole collection layer which provides a high-conversion-efficiency organic thin-film solar cell, these substances are more preferably completely dissolved in the above-mentioned solvent.

Furthermore, the hole collection layer composition of the present invention may contain, in order to improve the film formation property and the discharging performance from a coater, at least one high-viscosity organic solvent that has a viscosity of 10 to 200 mPa·s, particularly 35 to 150 mPa·s at 25° C. and has a boiling point of 50 to 300° C., particularly 150 to 250° C. at normal pressure.

The high-viscosity organic solvent is not to be considered particularly limited, and examples thereof includes cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol, and hexylene glycol.

The addition ratio of the high-viscosity organic solvent to the whole solvent for use in the composition of the present invention preferably falls within a range within which no solid is precipitated, and as long as no solid is precipitated, the addition ratio is preferably 5 to 80% by weight.

Furthermore, for the purposes of improving the wettability to the coated surface, adjusting the surface tension of the solvent, adjusting the polarity, adjusting the boiling point, and the like, other solvents that can impart film flatness at the time of heat treatment can be also mixed at a ratio of 1 to 90% by weight, preferably 1 to 50% by weight, with respect to the whole solvent for use in the composition.

Examples of such solvents include butyl cellosolve, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, ethyl carbitol, diacetone alcohol, γ-butyrolactone, ethyl lactate, and n-hexyl acetate.

The solid content concentration of the composition of the present invention is appropriately set in consideration of the viscosity and surface tension of the composition, the thickness of a thin film to be prepared, and the like, but is typically about 0.1 to 10.0% by weight, preferably 0.5 to 5.0% by weight, more preferably 1.0 to 3.0% by weight.

In addition, the ratio by weight between the charge-transporting substance and the electron-accepting dopant substance is also appropriately set in consideration of the charge-transporting property developed and the type of the charge-transporting substance, and typically, the electron-accepting dopant substance is 0 to 10, preferably 0.1 to 3.0, more preferably 0.2 to 2.0 per 1 of the charge-transporting substance.

Further, the viscosity of the hole collection layer composition for use in the present invention is appropriately adjusted depending on the coating method in consideration of the thickness and the like of a thin film to be prepared and the solid content concentration, but is typically about 0.1 mPa·s to 50 mPa·s at 25° C.

In preparing the composition of the present invention, the charge-transporting substance, the electron-accepting dopant substance, the solvent, and the like can be mixed in any order, as long as the solid content is uniformly dissolved or dispersed in the solvent. More specifically, for example, a method of dissolving the polyaniline derivative in a solvent, and then dissolving the electron-accepting dopant substance in the solution, a method of dissolving the electron-accepting dopant substance in a solvent, and then dissolving the polyaniline derivative in the solution, a method of mixing the polyaniline derivative and the electron-accepting dopant substance, and then adding the mixture to a solvent to dissolve the mixture therein can be all adopted as long as the solid content is uniformly dissolved or dispersed in the solvent.

It is to be noted that the order of adding the fluorochemical surfactant, the metal oxide nanoparticles, and the like is also arbitrary.

In addition, typically, the composition is prepared in an inert gas atmosphere at normal temperature and normal pressure, and unless the compounds in the composition are decomposed or significantly changed in composition, the composition may be prepared under an air atmosphere (in the presence of oxygen), or may be prepared while heating.

The hole collection layer of the present invention can be formed by applying the composition described above onto an anode in the case of a forward stacked organic thin-film solar cell, or onto the active layer in the case of an inversely stacked organic thin-film solar cell, and then firing the composition.

For the application, in consideration of the viscosity and surface tension of the composition, the desired thin film thickness, and the like, an optimum method may be adopted from various wet process methods such as a drop casting method, a spin coating method, a blade coating method, a dip coating method, a roll coating method, a bar coating method, a die coating method, an ink-jet method, and printing methods (letterpress, intaglio, lithographic, screen printing, etc.).

In addition, the composition is typically applied under an inert gas atmosphere at normal temperature and normal pressure, and unless the compounds in the composition are decomposed or significantly changed in composition, the composition may be applied under an air atmosphere (in the presence of oxygen), or may be applied while heating.

The film thickness is not particularly limited, but in each case, is preferably about 0.1 to 500 nm, even more preferably about 1 to 100 nm. As a method for changing the film thickness, there are methods such as a method of changing the solid content concentration in the composition, and a method of changing the amount of the solution for the application.

The method for manufacturing an organic thin-film solar cell with the use of the hole collection layer forming composition of the present invention is described below, but is not to be considered limited thereto.

(1) Forward Stacked Organic Thin-Film Solar Cell

[Formation of Anode Layer]: Step of Forming Anode Material Layer on Transparent Substrate Surface to Produce Transparent Electrode Inorganic oxides such as an indium tin oxide (ITO) and an indium zinc oxide (IZO), metals such as gold, silver, and aluminum, and highly charge-transporting organic compounds can be used, such as polythiophene derivatives and polyaniline derivatives can be used as the anode material. Among these materials, the ITO is most preferred. In addition, a substrate made of glass or a transparent resin can be used as the transparent substrate.

The method for forming an anode material layer (anode layer) is appropriately selected depending on the properties of the anode material. Typically, a dry process such as a vacuum deposition method or a sputtering method is selected in the case of a poorly soluble or poorly dispersible sublimable material, and in the case of a solution material or a dispersion material, an optimum process is adopted from among the various wet process methods described above, in consideration of the viscosity and surface tension of the composition, the thickness of a desired thin film, and the like.

Alternatively, commercially available transparent anode substrates can be used, and in this case, it is preferable to use a substrate subjected to a smoothing treatment, from the viewpoint of improving the yield of the element. In the case of using a commercially available transparent anode substrate, the method for manufacturing an organic thin-film solar cell of the present invention includes no step of forming the anode layer.

In the case of forming a transparent anode substrate with the use of, as an anode material, an inorganic oxide such as an ITO, the substrate is preferably, before stacking the upper layers, washed with a detergent, alcohol, pure water, or the like, and used. Furthermore, it is preferable to perform a surface treatment such as a UV ozone treatment and an oxygen-plasma treatment immediately before use. In the case where the anode material contains an organic substance as a principal component, there is no need perform the surface treatment.

[Formation of Hole Collection Layer]: Step of Forming Hole Collection Layer on Anode Material Layer Formed In accordance with the above-mentioned method, a hole collection layer is formed on the anode material layer with the use of the composition of the present invention.

[Formation of Active Layer]: Step of Forming Active Layer on Hole Collection Layer Formed The active layer may be a layer obtained by stacking an n layer that is a thin film made of an n-type semiconductor material and a p layer that is a thin film made of a p-type semiconductor material, or may be a non-stacked thin film made of a mixture of these materials.

Examples of the n-type semiconductor material include fullerene and [6,6]-phenyl-$C_{61}$-butyric acid methyl ester ($PC_{61}BM$), [6,6]-phenyl-$C_{71}$-butyric acid methyl ester ($PC_{71}BM$). On the other hand, examples of the p-type semiconductor material include polymers including a thiophene skeleton in the main chains, such as regioregular poly(3-hexylthiophene) (P3HT), PTB7 represented by the following formula (4), and such thienothiophene unit-containing polymers as described in JP-A 2009-158921 and WO 2010/008672, phthalocyanines such as CuPC and ZnPC, and porphyrins such as tetrabenzoporphyrin.

[Chem. 11]

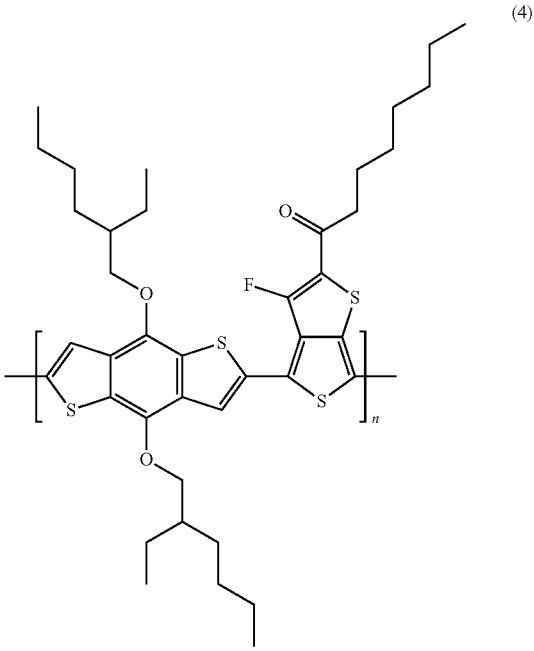

(4)

Among these materials, $PC_{61}BM$ and $PC_{71}BM$ are preferred as the n-type material, and the polymers including a thiophene skeleton in the main chains, such as PTB7, are preferred as the p-type material.

It is to be noted that "the thiophene skeleton in the main chain" herein represents a divalent aromatic ring composed of only thiophene, or a divalent fused aromatic ring including one or more thiophenes such as thienothiophene, benzothiophene, dibenzothiophene, benzodithiophene, naphthothiophene, naphthodithiophene, anthrathiophene, and anthradithiophene, which may be substituted with the substituents represented by $R^1$ to $R^6$.

Also for the method for forming the active layer, in the same manner as mentioned above, the various dry processes described above are selected in the case where the active layer material is a poorly soluble sublimable material, and in the case where the active layer material is a solution material or a dispersion material, an optimal process is adopted from among the various wet process methods described above, in consideration of the viscosity and surface tension of the composition, the desired thin film thickness, and the like.

[Formation of Electron Collection Layer]: Step of Forming Electron Collection Layer on Active Layer Formed If necessary, an electron collection layer may be formed between the active layer and the cathode layer for the purpose of increasing the efficiency of charge transfer.

Examples of the material that forms the electron collection layer include a lithium oxide ($Li_2O$), a magnesium oxide (MgO), alumina ($Al_2O_3$), a lithium fluoride (LiF), a sodium fluoride (NaF), a magnesium fluoride ($MgF_2$), a strontium fluorine ($SrF_2$), a cesium carbonate ($Cs_2CO_3$), an 8-quinolinol lithium salt (Liq), an 8-quinolinol sodium salt (Naq), bathocuproine (BCP), 4,7-diphenyl-1,10-phenanthroline (BPhen), a polyethyleneimine (PEI), and an ethoxylated polyethyleneimine (PEIE).

Also for the method for forming the electron collection layer, in the same manner as mentioned above, the various dry processes described above are selected in the case where the electron collection layer material is a poorly soluble sublimable material, and in the case where the electron collection layer material is a solution material or a dispersion material, an optimal process is adopted from among the various wet process methods described above, in consideration of the viscosity and surface tension of the composition, the desired thin film thickness, and the like.

[Formation of Cathode Layer]: Step of Forming Cathode Layer on Electron Collection Layer Formed Examples of the cathode material include metals such as aluminum, magnesium-silver alloys, aluminum-lithium alloys, lithium, sodium, potassium, cesium, calcium, barium, silver, and gold, inorganic oxides such as an indium tin oxide (ITO) and an indium zinc oxide (IZO), and highly charge-transporting organic compounds such as polythiophene derivatives and polyaniline derivatives, and multiple cathode materials can be used as a laminate or in mixture.

Also for the method for forming the cathode layer, in the same manner as mentioned above, the various dry processes described above are selected in the case where the cathode layer material is a poorly soluble or poorly dispersible sublimable material, and in the case where the cathode layer material is a solution material or a dispersion material, an optimal process is adopted from among the various wet process methods described above, in consideration of the viscosity and surface tension of the composition, the desired thin film thickness, and the like.

Formation of Carrier Block Layer

If necessary, a carrier block layer may be provided between arbitrary layers, for the purpose of controlling photocurrent rectification. In the case of providing a carrier blocking layer, typically, it is often the case, but not limited to, that an electron block layer is inserted between the active layer and the hole collection layer or the anode, whereas a hole block layer is inserted between the active layer and the electron collection layer or the cathode.

Examples of the material that forms the hole block layer include a titanium oxide, a zinc oxide, a tin oxide, bathocuproine (BCP), and 4,7-diphenyl 1,10-phenanthroline (BPhen).

Examples of the material that forms the electron block layer include N,N'-di(1-naphthyl)-N,N'-diphenylbenzidine (α-NPD) and triarylamine-based materials such as poly (triarylamine) (PTAA).

Also for the method for forming the carrier block layer, in the same manner as mentioned above, the various dry processes described above are selected in the case where the carrier block layer material is a poorly soluble or poorly dispersible sublimable material, and in the case where the carrier block layer material is a solution material or a dispersion material, an optimal process is adopted from among the various wet process methods described above, in consideration of the viscosity and surface tension of the composition, the desired thin film thickness, and the like.

(2) Inversely Stacked Organic Thin-Film Solar Cell

[Formation of Cathode Layer]: Step of Forming Cathode Material Layer on Transparent Substrate Surface to Produce Transparent Cathode Substrate Examples of the cathode material include a fluorine-doped tin oxide (FTO) in addition to the materials exemplified for the anode material of the forward stacked type mentioned above, and examples of the transparent substrate include the materials exemplified for the anode material of the forward stacked type mentioned above.

Also for the method for forming the cathode material layer (cathode layer), the dry processes described above are selected in the case of a poorly soluble or poorly dispersible sublimable material, and in the case where the active layer material is a solution material or a dispersion material, an optimal process is adopted from among the various wet process methods described above, in consideration of the viscosity and surface tension of the composition, the desired thin film thickness, and the like.

Also in this case, commercially available transparent cathode substrates can be suitably used, and it is preferable to use a substrate subjected to a smoothing treatment, from the viewpoint of improving the yield of the element. In the case of using a commercially available transparent cathode substrate, the method for manufacturing an organic thin-film solar cell of the present invention includes no step of forming the cathode layer.

In the case of forming a transparent cathode substrate with the use of an inorganic oxide as a cathode material, the same washing treatment and surface treatment may be performed as with the case of the forward stacked anode material.

[Formation of Electron Collection Layer]: Step of Forming Electron Collection Layer on Cathode Formed If necessary, an electron collection layer may be formed between the active layer and the cathode layer for the purpose of increasing the efficiency of charge transfer.

Examples of the material that forms the electron collection layer include a zinc oxide (ZnO), a titanium oxide (TiO), and a tin oxide (SnO), in addition to the materials exemplified for the material of the forward stacked type mentioned above.

Also for the method for forming the electron collection layer, the dry processes described above are selected in the case of a poorly soluble or poorly dispersible sublimable material, and in the case where the active layer material is a solution material or a dispersion material, an optimal process is adopted from among the various wet process methods described above, in consideration of the viscosity and surface tension of the composition, the desired thin film thickness, and the like. Alternatively, a method may be adopted in which a precursor layer of an inorganic oxide is formed on the cathode by using a wet process (in particular, a spin coating method or a slit coating method), and then subjected to firing to form an inorganic oxide layer.

[Formation of Active Layer]: Step of Forming Active Layer on Electron Collection Layer Formed The active layer may be a layer obtained by stacking an n layer that is a thin film made of an n-type semiconductor material and a p layer that is a thin film made of a p-type semiconductor material, or may be a non-stacked thin film made of a mixture of these materials.

Examples of the n-type and p-type semiconductor materials include the same materials exemplified for the semiconductor material of the forward stacked type mentioned above, and, $PC_{61}BM$ and $PC_{71}BM$ are preferred as the n-type material, and the polymers including a thiophene skeleton in the main chains, such as PTB7, are preferred as the p-type material.

The method for forming the active layer is also the same as the method described for the active layer of the forward stacked type mentioned above.

[Formation of Hole Collection Layer]: Step of Forming Hole Collection Layer on Active Layer Material Layer Formed In accordance with the method mentioned above, a hole collection layer is formed on the active layer material layer with the use of the composition of the present invention.

[Formation of Anode Layer]: Step of Forming Anode Layer on Hole Collection Layer Formed Examples of the anode material include the same materials as the anode materials for the forward stacked type mentioned above, and the method for forming the anode layer is also the same as for the cathode layer of the forward stacked type.

Formation of Carrier Block Layer

As in the case of the forward stacked element, if necessary, a carrier block layer may be provided between arbitrary layers, for the purpose of controlling photocurrent rectification.

Examples of the material that forms the hole block layer and the material that forms the electron block layer include the same materials as mentioned above, and the methods for forming the carrier block layers are also the same as mentioned above.

The OPV element prepared by the method exemplified above is introduced again into the glove box and then subjected to a sealing operation under an inert gas atmosphere such as nitrogen in order to prevent the element from being degraded by the atmosphere, thereby making it possible to achieve the function as a solar cell and measure solar cell characteristics in the sealed condition.

Examples of the sealing method include a method of attaching, to the film formation side of the organic thin-film solar cell element, a recessed glass substrate with a UV curable resin attached to an end of the substrate, under an inert gas atmosphere, and curing the resin by UV irradiation, and a method of carrying out sealing of film sealing type by an approach such as sputtering under a vacuum.

EXAMPLES

Hereinafter, the present invention is described more specifically with reference to Examples and Comparative Examples, but the present invention is not to be considered limited to the following Examples. It is to be noted here is the equipment used:

(1) Glove box: VAC glove box system manufactured by YAMAHACHI & CO., LTD.

(2) Vapor deposition apparatus:

vacuum deposition apparatus manufactured by Aoyama Engineering Co., Ltd.

(3) Solar simulator: OTENTOSUN-III, AM1.5G filter, radiation intensity: 100 mW/cm$^2$, manufactured by Bunkoukeiki Co., Ltd.

(4) Source measure unit:
  2612A manufactured by Keithley Instruments, Inc.
(5) Thickness measurement apparatus:
  SURFCORDER ET-4000 manufactured by Kosaka Laboratory Ltd.

[1] Preparation of Active Layer Composition

Preparation Example 1

To a sample bottle containing 20 mg of PTB7 (manufactured by 1-Material) and 30 mg of $PC_{61}BM$ (manufactured by Frontier Carbon Corporation, product name: nanom spectra E100), 2.0 mL of chlorobenzene was added, and stirring was performed for 15 hours on a hot plate at 80° C. After allowing the solution to cool to room temperature, 60 μL of 1,8-diiodooctane (manufactured by Tokyo Chemical Industry Co., Ltd.) was added to the solution, and the solution was stirred to obtain a solution A1 (active layer composition).

[2] Production of Hole Collection Layer Composition

Example 1-1

In 3.16 g of distilled water, 47.5 mg of the arylsulfonic acid compound A represented by the above-mentioned formula (2-1), synthesized according to the description in WO 2006/025342 (the same applies hereinafter), was dissolved, and 1.86 g of aquaPASS-01X (manufactured by Mitsubishi Chemical Corporation, 5.1% by weight aqueous solution), 36.8 mg of SNOWTEX ST-O (manufactured by Nissan Chemical Corporation, 20.4% by weight aqueous dispersion), and 4.90 g of ethanol were added to the solution to prepare a brownish-red solution of 1.5% by weight in concentration. To the obtained brownish-red solution, a fluorochemical nonionic surfactant (FN-1287, manufactured by DKS Co., Ltd.) was added to reach 0.7% by weight based on the whole brownish-red solution, and the mixture was filtered through a syringe filter of 0.45 μm in pore size to obtain a hole collection layer composition B1.

Example 1-2

In 3.25 g of distilled water, 45.0 mg of the arylsulfonic acid compound A represented by the above-mentioned formula (2-1) was dissolved, and 1.77 g of aquaPASS-01X (manufactured by Mitsubishi Chemical Corporation, 5.1% by weight aqueous solution), 73.5 mg of SNOWTEX ST-O (manufactured by Nissan Chemical Corporation, 20.4% by weight aqueous dispersion), and 4.87 g of ethanol were added to the solution to prepare a brownish-red solution of 1.5% by weight in concentration. To the obtained brownish-red solution, a fluorochemical nonionic surfactant (FN-1287, manufactured by DKS Co., Ltd.) was added to reach 0.7% by weight based on the whole brownish-red solution, and the mixture was filtered through a syringe filter of 0.45 μm in pore size to obtain a hole collection layer composition B2.

Example 1-3

In 3.44 g of distilled water, 40.0 mg of the arylsulfonic acid compound A represented by the above-mentioned formula (2-1) was dissolved, and 1.57 g of aquaPASS-01X (manufactured by Mitsubishi Chemical Corporation, 5.1% by weight aqueous solution), 147 mg of SNOWTEX ST-O (manufactured by Nissan Chemical Corporation, 20.4% by weight aqueous dispersion), and 4.81 g of ethanol were added to the solution to prepare a brownish-red solution of 1.5% by weight in concentration. To the obtained brownish-red solution, a fluorochemical nonionic surfactant (FN-1287, manufactured by DKS Co., Ltd.) was added to reach 0.7% by weight based on the whole brownish-red solution, and the mixture was filtered through a syringe filter of 0.45 μm in pore size to obtain a hole collection layer composition B3.

Comparative Example 1-1

In 6.13 g of distilled water, 100 mg of the arylsulfonic acid compound A represented by the above-mentioned formula (2-1) was dissolved, and 3.92 g of aquaPASS-01X (manufactured by Mitsubishi Chemical Corporation, 5.1% by weight aqueous solution), and 9.85 g of ethanol were added to the solution to prepare a dark blue solution of 1.5% by weight in concentration. To the obtained brownish-red solution, a fluorochemical nonionic surfactant (FN-1287, manufactured by DKS Co., Ltd.) was added to reach 0.7% by weight based on the whole brownish-red solution, and the mixture was filtered through a syringe filter of 0.45 μm in pore size to obtain a hole collection layer composition C1.

[3] Preparation of Laminate for Adhesion Test

Example 2-1

A 20 mm×20 mm glass substrate with an ITO transparent conductive layer was subjected to a UV/ozone treatment for 15 minutes. Onto this substrate, a zinc oxide solution (manufactured by Genes'Ink) to serve as an electron collection layer was delivered by drops to form a film by a spin coating method. The film thickness of the electron collection layer was about 20 nm. Thereafter, in a glove box replaced with an inert gas, the solution A1 obtained in Preparation Example 1 was delivered by drops onto the formed electron collection layer to form a film by spin coating, thereby forming an active layer.

Next, the hole collection layer composition B1 prepared in Example 1-1 was applied onto the active layer by spin coating, and then subjected to an annealing treatment at 60° C. for 30 minutes, and further at 80° C. for 10 minutes with the use of a hot plate to form a hole collection layer. The film thickness of the hole collection layer was about 50 nm.

Example 2-2

In the same way as in Example 2-1 except for the use of the hole collection layer composition B2 instead of the hole collection layer composition B1, a laminate for an adhesion test was prepared.

Example 2-3

In the same way as in Example 2-1 except for the use of the hole collection layer composition B3 instead of the hole collection layer composition B1, a laminate for an adhesion test was prepared.

Comparative Example 2-1

In the same way as in Example 2-1 except for the use of the hole collection layer composition C1 instead of the hole collection layer composition B1, a laminate for an adhesion test was prepared.

[4] Adhesion Test

The above-mentioned laminates prepared in Examples 2-1 to 2-3 and Comparative Example 2-1 were subjected to a peeling test. The peeling test was carried out in accordance with JIS K 5600-5-6. Six cuts were extensively made with a feeling of 2 mm in the film to be evaluated, and then, a cellophane tape with a width of 18 mm and an adhesion strength of 4 N/cm was attached to the film surface, and peeled in a direction of about 60°. The degree of adhesion between the substrate surface and the cellophane tape surface after the peeling was visually observed to evaluate the adhesion. The results are shown in Table 1.

TABLE 1

| | Peeling Test |
|---|---|
| Example 2-1 | peeling up to 35% |
| Example 2-2 | peeling up to 15% |
| Example 2-3 | peeling up to 5% |
| Comparative Example 2-1 | peeling up to 100% |

As shown in Table 1, it is determined that the use of the hole collection layer composition for of the present invention greatly improves the adhesion to the active layer.

[5] Preparation of Organic Thin-Film Solar Cell

Example 3-1

A 20 mm×20 mm glass substrate with an ITO transparent conductive layer to serve as a cathode, subjected to patterning into a 2 mm×20 mm stripe shape, was subjected to a UV/ozone treatment for 15 minutes. Onto this substrate, a zinc oxide solution (manufactured by Genes'Ink) to serve as an electron collection layer was delivered by drops to form a film by a spin coating method. The film thickness of the electron collection layer was about 20 nm. Thereafter, in a glove box replaced with an inert gas, the solution A1 obtained in Preparation Example 1 was delivered by drops onto the formed electron collection layer to form a film by spin coating, thereby forming an active layer.

Next, the hole collection layer composition B1 prepared in Example 1-1 was applied onto the active layer by spin coating, and then dried at room temperature to form a hole collection layer. The film thickness of the hole collection layer was about 50 nm.

Finally, with the laminate substrate placed in the vacuum deposition apparatus, the apparatus was evacuated until the degree of vacuum in the apparatus reached $1\times10^{-3}$ Pa or less, and a silver layer to serve as an anode was vapor-deposited therein by a resistance heating method to have a thickness of 80 nm, thereby preparing an inversely stacked OPV element where the area of intersection between the stripe-shaped ITO layer and the silver layer was 2 mm×2 mm. Furthermore, the element was subjected to an annealing treatment by heating at 60° C. for 30 minutes with the use of a hot plate.

Examples 3-2 to 3-3

In the same way as in Example 3-1 except for the use of the hole collection layer compositions B2 to B3 instead of the hole collection layer composition B1, inversely stacked OPV elements were prepared.

[6] Characteristic Evaluation

The above-mentioned respective OPV elements prepared in Examples 3-1 to 3-3 were evaluated for short-circuit current density (Jsc [mA/cm$^2$]), open-circuit voltage (Voc [V]), fill factor (FF), and PCE [%]. The results are shown in Table 1.

It is to be noted that the PCE [%] was calculated from the following equation.

PCE[%]=Jsc[mA/cm$^2$]×Voc[V]×FF÷incident light intensity (100 [mW/cm$^2$])×100

TABLE 2

| | $J_{sc}$ (mA/cm$^2$) | $V_{oc}$ (V) | FF | PCE (%) |
|---|---|---|---|---|
| Example 3-1 | 11.9 | 0.79 | 0.64 | 6.0 |
| Example 3-2 | 11.9 | 0.80 | 0.61 | 5.8 |
| Example 3-3 | 12.0 | 0.78 | 0.53 | 5.0 |

As shown in Table 2, it is determined that the use of the hole collection layer composition of the present invention allows an inversely stacked OPV element which shows favorable HTL characteristics.

The invention claimed is:

1. A hole collection layer composition for an organic photoelectric conversion element, comprising a charge-transporting substance comprising a polyaniline derivative represented by the formula (1), a fluorochemical surfactant, metal or metalloid oxide nanoparticles, and a solvent:

[Chem. 1]

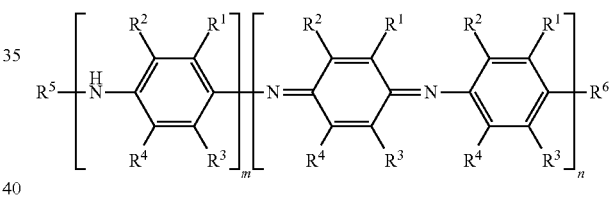

wherein R$^1$ to R$^6$ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, and an aralkyl group having 7 to 20 carbon atoms, or an acyl group having 1 to 20 carbon atoms, one of R$^1$ to R$^4$ is a sulfonic acid group, and one or more of the remaining R$^1$ to R$^4$ are an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, or an aralkyl group having 7 to 20 carbon atoms, and m and n are respectively numbers that meet $0 \leq m \leq 1$, $0 \leq n \leq 1$, and $m+n=1$.

2. The hole collection layer composition for an organic photoelectric conversion element according to claim 1, wherein the metal or metalloid oxide nanoparticles are SiO$_2$.

3. The hole collection layer composition for an organic photoelectric conversion element according to claim 2, wherein the SiO$_2$ is a silica sol.

4. The hole collection layer composition for an organic photoelectric conversion element according to claim 3, wherein a dispersion medium of the silica sol is water.

5. The hole collection layer composition for an organic photoelectric conversion element according to claim 1, wherein the fluorochemical surfactant is a fluorochemical nonionic surfactant.

6. The hole collection layer composition for an organic photoelectric conversion element according to claim 5, wherein the fluorochemical nonionic surfactant is at least one selected from the following formulas (A2) and (B2):

[Chem. 2]

$$R_f COO(CH_2CH_2O)_n H \quad (A2)$$

$$R_f (CH_2CH_2O)_n H \quad (B2)$$

wherein $R_f$ each independently represents a perfluoroalkyl group having 1 to 40 carbon atoms, and n each independently represents an integer of 1 to 20.

7. The hole collection layer composition for an organic photoelectric conversion element according to claim 1, wherein the $R^1$ is a sulfonic acid group, and the $R^4$ is an alkoxy group having 1 to 20 carbon atoms.

8. The hole collection layer composition for an organic photoelectric conversion element according to claim 1, the hole collection layer composition comprising an electron-accepting dopant substance that is different from the polyaniline derivative represented by the formula (1).

9. The hole collection layer composition for an organic photoelectric conversion element according to claim 8, wherein the electron-accepting dopant substance is a Bronsted acid.

10. The hole collection layer composition for an organic photoelectric conversion element according to claim 9, wherein the electron-accepting dopant substance is an arylsulfonic acid compound represented by the formula (2):

[Chem. 3]

$$\left( \begin{matrix} A-X \\ | \\ (SO_3H)_l \end{matrix} \right)_q B \quad (2)$$

wherein X represents O, A represents a naphthalene ring or an anthracene ring, B represents a divalent to tetravalent perfluorobiphenyl group, l represents the number of sulfonic acid groups bonded to A, and is an integer that meets $1 \leq l \leq 4$, and q represents the number of bonds between B and X, and is an integer that meets 2 to 4.

11. The hole collection layer composition for an organic photoelectric conversion element according to claim 1, wherein the solvent comprises one, or two or more solvents selected from alcohol solvents and water.

12. The hole collection layer composition for an organic photoelectric conversion element according to claim 1, wherein the organic photoelectric conversion element is an organic thin-film solar cell, a dye-sensitized solar cell, or an optical sensor.

13. A hole collection layer obtained by using the hole collection layer composition for an organic photoelectric conversion element according to claim 1.

14. An organic photoelectric conversion element comprising the hole collection layer according to claim 13.

15. An organic photoelectric conversion element comprising the hole collection layer according to claim 13 and an active layer provided so as to be brought into contact with the hole collection layer.

16. The organic photoelectric conversion element according to claim 14, wherein the active layer comprises a fullerene derivative.

17. The organic photoelectric conversion element according to claim 14, wherein the active layer comprises a polymer comprising a thiophene in a main chain.

18. The organic photoelectric conversion element according to claim 14, wherein the active layer comprises a fullerene derivative and a polymer comprising a thiophene skeleton in a main chain.

19. The organic photoelectric conversion element according to claim 14, wherein the organic photoelectric conversion element is of an inversely stacked type.

20. The organic photoelectric conversion element according to claim 14, wherein the organic photoelectric conversion element is an organic thin-film solar cell, a dye-sensitized solar cell, or an optical sensor.

21. The organic photoelectric conversion element according to claim 20, wherein the organic photoelectric conversion element has a top-anode structure.

22. A charge-transporting composition comprising a charge-transporting substance comprising a polyaniline derivative represented by the formula (1), an electron-accepting dopant substance that is different from the polyaniline derivative represented by the formula (1), a fluorochemical surfactant, metal or metalloid oxide nanoparticles, and a solvent:

[Chem. 4]

$$\left[ \begin{matrix} R^2 & R^1 \\ R^5-N & \\ & \\ R^4 & R^3 \end{matrix} \right]_m \left[ \begin{matrix} R^2 & R^1 \\ N & \\ & \\ R^4 & R^3 \end{matrix} \right] \left[ \begin{matrix} R^2 & R^1 \\ N-R^6 \\ & \\ R^4 & R^3 \end{matrix} \right]_n \quad (1)$$

wherein $R^1$ to $R^6$ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, and an aralkyl group having 7 to 20 carbon atoms, or an acyl group having 1 to 20 carbon atoms, one of $R^1$ to $R^4$ is a sulfonic acid group, and one or more of the remaining $R^1$ to $R^4$ are an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, or an aralkyl group having 7 to 20 carbon atoms, and m and n are respectively numbers that meet $0 \leq m \leq 1$, $0 \leq n \leq 1$, and $m+n=1$.

23. The charge-transporting composition according to claim 22, wherein the electron-accepting dopant substance is an arylsulfonic acid compound represented by the formula (2):

[Chem. 5]

(2)

wherein X represents O, A represents a naphthalene ring or an anthracene ring, B represents a divalent to tetravalent perfluorobiphenyl group, l represents the number of sulfonic acid groups bonded to A, and is an integer that meets $1 \leq l \leq 4$, and q represents the number of bonds between B and X, and is an integer that meets 2 to 4.

* * * * *